(12) United States Patent  (10) Patent No.: US 11,698,585 B2
Yamaguchi  (45) Date of Patent: Jul. 11, 2023

(54) IMPRINT METHOD, IMPRINT APPARATUS, DETERMINATION METHOD, AND ARTICLE MANUFACTURING METHOD

(71) Applicant: CANON KABUSHIKI KAISHA, Tokyo (JP)

(72) Inventor: Soushi Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 101 days.

(21) Appl. No.: 17/234,878

(22) Filed: Apr. 20, 2021

(65) Prior Publication Data

US 2021/0356860 A1  Nov. 18, 2021

(30) Foreign Application Priority Data

May 12, 2020 (JP) .................................. 2020-084136

(51) Int. Cl.
*G03F 7/00* (2006.01)
(52) U.S. Cl.
CPC .................................. *G03F 7/0002* (2013.01)
(58) Field of Classification Search
CPC .................................................. G03F 7/0002
See application file for complete search history.

(56) References Cited

U.S. PATENT DOCUMENTS

| 10,935,883 | B2 | 3/2021 | Ghariehali | |
|---|---|---|---|---|
| 2007/0054097 | A1* | 3/2007 | Suehira | B82Y 10/00 |
| | | | | 428/195.1 |
| 2010/0075443 | A1* | 3/2010 | Yoneda | G01N 21/956 |
| | | | | 257/E21.53 |
| 2010/0233432 | A1* | 9/2010 | Okushima | G03F 7/0002 |
| | | | | 428/156 |
| 2013/0078821 | A1* | 3/2013 | Furutono | G03F 7/0002 |
| | | | | 264/447 |
| 2016/0001492 | A1* | 1/2016 | Yamaguchi | B29C 33/424 |
| | | | | 425/225 |
| 2018/0004091 | A1* | 1/2018 | Shinoda | G03F 7/0002 |
| 2018/0067392 | A1* | 3/2018 | Murasato | G03F 7/0002 |
| 2018/0299772 | A1* | 10/2018 | Jung | G03F 7/0002 |
| 2020/0319547 | A1* | 10/2020 | Shinoda | G03F 7/70683 |
| 2021/0294208 | A1* | 9/2021 | Mitra | G03F 7/70625 |

FOREIGN PATENT DOCUMENTS

| JP | 2018206974 A | 12/2018 |
|---|---|---|
| JP | 2019068051 A | 4/2019 |

* cited by examiner

*Primary Examiner* — Deoram Persaud
(74) *Attorney, Agent, or Firm* — Rossi, Kimms & McDowell LLP

(57) ABSTRACT

The present invention provides an imprint method of forming a pattern of an imprint material on a substrate using a mold, the method including obtaining a state of a light blocking member provided outside a pattern region of the mold, the light blocking member being configured to block light, determining, based on the state of the light blocking member obtained in the obtaining, whether the mold is usable, and curing the imprint material by irradiating the imprint material with the light in a state in which the mold determined to be usable in the determining is in contact with the imprint material on the substrate.

14 Claims, 9 Drawing Sheets

IMPRINT METHOD, IMPRINT APPARATUS, DETERMINATION METHOD, AND ARTICLE MANUFACTURING METHOD

BACKGROUND OF THE INVENTION

Field of the Invention

The present invention relates to an imprint method, an imprint apparatus, a determination method, and an article manufacturing method.

Description of the Related Art

An imprint technique is a microfabrication technique that supplies (applies) an uncured imprint material onto a substrate, and brings the imprint material into contact with a mold, thereby forming a pattern of the imprint material corresponding to a fine pattern (projection and groove structure) formed in the mold.

In the imprint technique, one example of the method of curing an imprint material is a photo-curing method. The photo-curing method is a method that forms a pattern of an imprint material on a substrate by irradiating the imprint material with light such as ultraviolet light in a state in which the imprint material supplied onto the substrate is in contact with a mold, and releasing the mold from the cured imprint material.

In the imprint apparatus that employs such an imprint technique, upon bringing an imprint material on a substrate with a mold, the imprint material may protrude beyond an intended pattern forming region, that is, so-called shot region. Such a tendency becomes conspicuous particularly when the high throughput required for the imprint apparatus is to be achieved.

The imprint material protruding outside the shot region on the substrate may cause various problems in the subsequent imprint process. For example, a portion where the imprint material protrudes becomes defective. In addition, when a pattern is formed in a shot region to which the imprint material protrudes, the protruding imprint material and the mold come into contact with each other and the pattern of the mold may be broken. Therefore, Japanese Patent Laid-Open No. 2019-068051 proposes a technique for reducing the influence of the imprint material protruding outside the shot region on the substrate. Japanese Patent Laid-Open No. 2019-068051 discloses a technique that minimizes curing of the imprint material protruding outside the shot region on the substrate by providing a light blocking member on the pattern surface of the mold.

Further, in the imprint apparatus, it is necessary to manage the molds as consumables, and if a consumed mold is used, the performance of the imprint apparatus, for example, the accuracy of the pattern formed on the substrate is affected. Therefore, Japanese Patent Laid-Open No. 2018-206974 proposes a technique of determining, based on a change in contrast of an alignment signal obtained by detecting an alignment mark provided on the mold, the usable period of the mold in which normal alignment is guaranteed.

A mold used in the imprint apparatus is different from an original (reticle or mask) used in a projection exposure apparatus in that it is brought into contact with an imprint material on a substrate and released from the cured imprint material on the substrate. Such direct contact between the mold and the imprint material causes not only breakage or wear of the pattern of the mold and adhesion of the imprint material to the mold, but also peeling of the light blocking member.

In addition, breakage and wear of the pattern of the mold and adhesion of the imprint material to the mold affect the pattern to be formed on the substrate in the subsequent imprint process. For example, if the imprint process is executed with the imprint material adhering to the mold, breakage of the pattern of the mold may be caused as in a case in which a foreign substance is caught between the mold and the substrate. Therefore, in order to remove the imprint material adhering to the mold, the mold is cleaned regularly or irregularly.

Since cleaning of the mold is performed without distinguishing between the imprint material adhering to the mold and the light blocking member, the light blocking member is also cleaned in addition to the imprint material, and this causes damage such as peeling or breakage of the light blocking member. Therefore, by repeatedly cleaning the mold, the light blocking performance of the light blocking member is deteriorated and the intended light blocking effect cannot be obtained. As a result, the imprint material protruding outside the shot region on the substrate is cured.

SUMMARY OF THE INVENTION

The present invention provides a technique advantageous in determining whether a mold is usable.

According to one aspect of the present invention, there is provided an imprint method of forming a pattern of an imprint material on a substrate using a mold, the method including obtaining a state of a light blocking member provided outside a pattern region of the mold, the light blocking member being configured to block light, determining, based on the state of the light blocking member obtained in the obtaining, whether the mold is usable, and curing the imprint material by irradiating the imprint material with the light in a state in which the mold determined to be usable in the determining is in contact with the imprint material on the substrate.

Further aspects of the present invention will become apparent from the following description of exemplary embodiments with reference to the attached drawings.

DESCRIPTION OF THE EMBODIMENTS

Figure 1:
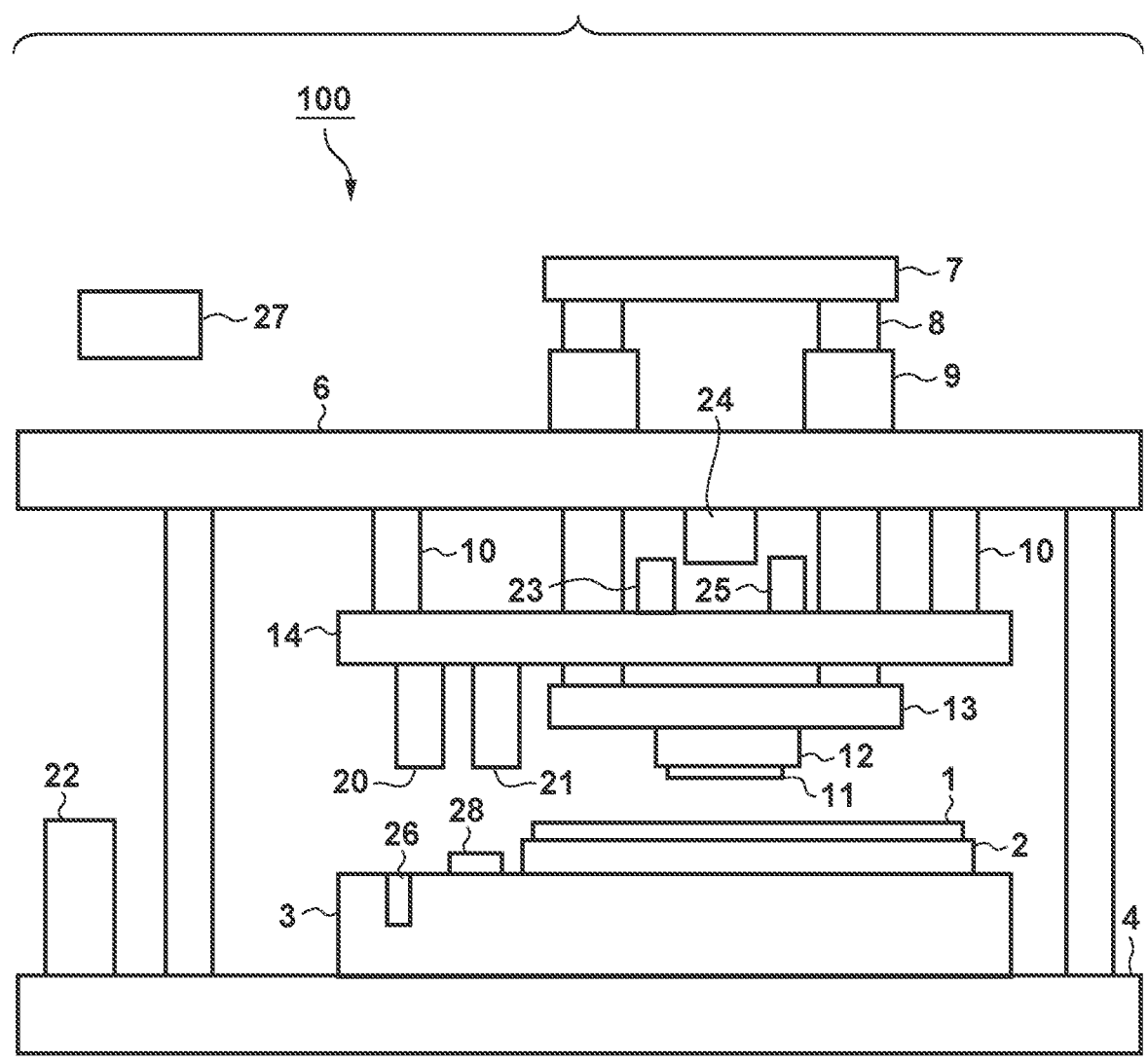
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an imprint apparatus 100 according to an aspect of the present invention. The imprint apparatus 100 is a lithography apparatus that is employed in a lithography step, which is a manufacturing step of a device such as a semiconductor device, a liquid crystal display device, a magnetic storage medium, or the like serving as an article, and forms a pattern on a substrate. The imprint apparatus 100 brings an imprint material supplied onto a substrate into contact with a mold and applies curing energy to the imprint material, thereby forming a pattern of a cured product to which a pattern of the mold has been transferred. Note that the mold is also referred to as a template.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

As shown in FIG. 1, the imprint apparatus 100 includes a substrate chuck 2, a substrate stage 3, a base plate 4, a top plate 6, a guide bar plate 7, guide bars 8, a mold elevating unit 9, columns 10, a mold chuck 12, a mold stage 13, and an alignment shelf 14. The imprint apparatus 100 further includes a dispenser 20, an off-axis alignment (OA) scope 21, an alignment scope 23, a light source 24, an image capturing unit 25, a distance measurement unit 26, a control unit 27, and an illuminance measurement unit 28.

In the specification and the accompanying drawings, directions will be indicated by an XYZ coordinate system in which directions parallel to the surface of a substrate 1 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively. Control or driving (moving) concerning the X-axis, the Y-axis, and the Z-axis means control or driving (moving) concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

The substrate 1 is loaded from the outside of the imprint apparatus 100 by a substrate conveyance unit 22 including a conveyance hand or the like, and held by the substrate chuck 2 supported by the substrate stage 3. The substrate stage 3 is supported by the base plate 4, and drives in the X-axis direction and the Y-axis direction to position the substrate 1 at a predetermined position.

A mold 11 includes a pattern to be transferred to the substrate 1, and held by the mold chuck 12. The mold chuck 12 is supported by the mold stage 13, and has a function of correcting an inclination of the mold 11 about the Z-axis. Each of the mold chuck 12 and the mold stage 13 includes an opening (not shown) through which light (ultraviolet light) emitted from the light source 24 via a collimator lens (not shown) passes. In addition, the mold chuck 12 and the mold stage 13 are provided with a load cell for measuring the pressing force (imprinting force) of the mold 11 against the imprint material on the substrate.

Each guide bar 8 extends through the top plate 6. One end of the guide bar 8 is fixed to the guide bar plate 7, and the other end is fixed to the mold stage 13. The mold elevating unit 9 drives each guide bar 8 in the Z-axis direction to bring the mold 11 held by the mold chuck 12 into contact with the imprint material on the substrate or release the mold 11 from the cured imprint material on the substrate.

The alignment shelf 14 is suspended from the top plate 6 via the support columns 10. Each guide bar 8 extends through the alignment shelf 14. Further, the alignment shelf 14 is provided with a height measurement system (not shown) which is used to measure the height (flatness) of the substrate 1 held by the substrate chuck 2 using, for example, an obliquely incident image shift method.

The dispenser 20 supplies an uncured imprint material onto a substrate (a plurality of shot regions thereof). The dispenser 20 is supplied with the imprint material via a supply pipe (not shown) from a tank (not shown) storing the imprint material.

In this embodiment, the alignment scope 23 is formed by a TTM (Through-The-Mold) measurement system, and includes an optical system and an image capturing system used to observe an alignment mark provided on the substrate 1 and an alignment mark provided on the mold 11. The alignment scope 23 is used for so-called die-by-die alignment in which, for each shot region on the substrate, the relative position (positional shift) between the alignment mark provided on the substrate 1 and the alignment mark provided on the mold 11 is measured and the positional shift is corrected. The alignment scope 23 has a function of detecting the alignment mark provided on the substrate 1 and the alignment mark provided on the mold 11 and generating an alignment signal which is used in alignment between the substrate 1 and the mold 11.

The off-axis alignment (OA) scope 21 is supported by the alignment shelf 14. The OA scope 21 is used for global alignment in which an alignment mark provided in each of a plurality of sample shot regions on a substrate is detected to determine the position of each of a plurality of shot regions on the substrate. By obtaining the positional relationship between the mold 11 and the substrate stage 3 by the alignment scope 23 and obtaining the positional relationship between the substrate stage 3 and the substrate 1 by the OA scope 21, relative alignment between the substrate 1 and the mold 11 can be performed.

An imprint material on a substrate is irradiated with light including a wavelength capable of curing the imprint material from the light source 24. Since the illuminance of light emitted from the light source 24 decreases over time, the amount (exposure amount) of light for curing the imprint material may be controlled by an irradiation time or a voltage supplied to the light source 24.

The image capturing unit 25 is arranged at a position where it overlooks the mold 11, and captures a visual field including a pattern region of the mold 11. The image capturing unit 25 captures a contact point between an imprint material on a substrate and the pattern region of the mold 11 and an extending contact region between the imprint material and the pattern region of the mold 11 (the imprint material on the substrate being extended by the mold 11). Thus, the image capturing unit 25 captures the imprint material on the substrate being filled into the pattern region (projection and groove portion) of the mold 11.

The distance measurement unit 26 is provided in the substrate stage 3. The distance measurement unit 26 measures (measures a plurality of times) the distance between the mold 11 held by the mold chuck 12 and the substrate stage 3 while the substrate stage 3 is driven with respect to the mold 11 (while the mold 11 and the substrate stage 3 are relatively moved). The distance between the mold 11 and the substrate stage 3 measured by the distance measurement unit 26 is used by the control unit 27 to determine whether the mold 11 is normally held by the mold chuck 12. If the mold 11 is not normally held by the mold chuck 12, the mold 11 may fall and be broken, or the mold 11 may come into contact with an imprint material on a substrate at an unintended angle. In such a case, it is preferable to stop (inhibit) execution of the imprint material, and perform recovery processing for causing the mold chuck 12 to normally hold the mold 11.

The illuminance measurement unit 28 is arranged on the substrate stage 3, and measures the illuminance of light emitted from the light source 24. When the illuminance of light emitted from the light source 24 is measured, the substrate stage 3 is driven so as to locate the illuminance measurement unit 28 below the mold 11 held by the mold stage 13. By regularly measuring the illuminance by the illuminance measurement unit 28, a change amount of the illuminance of light emitted from the light source 24 can be obtained and, based on the change amount, the exposure amount with respect to an imprint material on a substrate can be controlled (corrected). As has been described above, the exposure amount is controlled by controlling the irradiation time of irradiating the imprint material with light from the light source 24 or a voltage supplied to the light source 24.

The control unit 27 is formed by an information processing apparatus (computer) including a CPU, a memory, and the like, and controls the entire imprint apparatus 100 in accordance with a program stored in a storage unit. The control unit 27 executes, by controlling respective units of the imprint apparatus 100, an imprint process including processing of curing an imprint material on a substrate by irradiating the imprint material with light in a state in which the mold 11 is in contact with the imprint material. In the imprint process, the substrate 1 and the mold 11 are aligned while bringing the imprint material on the substrate into contact with the mold 11. If the alignment between the substrate 1 and the mold 11 is completed, in a state in which the imprint material on the substrate is in contact with the mold 11, the imprint material is irradiated with light from the light source 24 via the mold 11 to cure the imprint material on the substrate. If curing of the imprint material on the substrate is completed, the mold elevating unit 9 releases the mold 11 from the cured imprint material on the substrate. Thus, a pattern of the imprint material corresponding to the pattern of the mold 11 is formed on the substrate.

As has been described above, in the imprint process, the imprint material on the substrate is brought into contact with the mold 11, so that a foreign substance existing in a space between the substrate 1 and the mold 11 may be caught. Further, upon releasing the mold 11 from the cured imprint material on the substrate, a part of the imprint material may peel off from the substrate 1 and adhere to the mold 11. The foreign substance or the imprint material adhering to the mold 11 affects the pattern to be formed on the substrate in the subsequent imprint process.

Therefore, the mold 11 with the foreign substance or the imprint material adhering thereto is unloaded from the imprint apparatus 100, and cleaning of the mold 11 is performed. Cleaning of the mold 11 includes wet cleaning using a solvent which is called SPM, and dry cleaning using plasma.

Note that in order to minimize curing of the imprint material protruding outside a shot region on the substrate, more specifically, in order to block light (leakage light) toward outside the pattern region of the mold 11, a light blocking member is provided. Cleaning of the mold 11 is performed without distinguishing the foreign substance and the imprint material adhering to the mold 11 from the light blocking member and the alignment mark provided on the mold 11. Accordingly, by cleaning the mold 11, the light blocking member is also cleaned together with the foreign substance and the imprint material adhering to the mold 11. This results in a decrease in thickness of the light blocking member, or partial or whole removal of the light blocking member. In such a case, the light blocking performance of the light blocking member is deteriorated and the intended light blocking effect cannot be obtained, so that the imprint material protruding outside the shot region on the substrate is cured. Therefore, the mold with significantly deteriorated light blocking performance cannot be used for the imprint process.

Thus, in this embodiment, the control unit 27 is functioned as a determination unit that determines based on the state of the light blocking member provided on the mold 11 whether the mold 11 is usable, and a processing unit that executes the imprint process using the mold 11 determined to be usable. An imprint method including determination as to whether the mold 11 is usable in this embodiment will be described below.

Figure 2A:
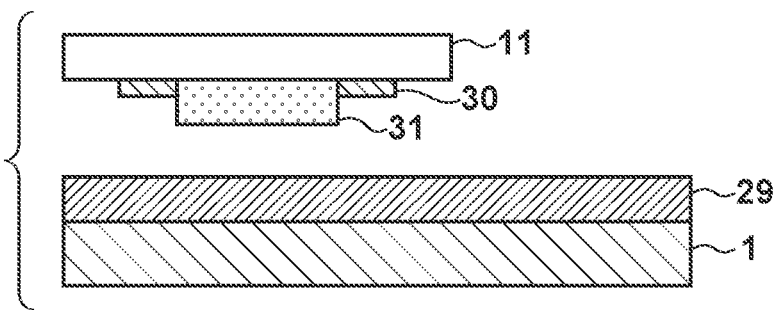
FIGS. 2A to 2H are views for describing an imprint process.

First, with reference to FIGS. 2A to 2H, an imprint process using the mold 11 provided with a light blocking member 30 will be described. Here, an imprint material 29 has been supplied onto the substrate by the dispenser 20. Further, as shown in FIG. 2A, the light blocking member 30 is provided outside a pattern region 31 of the mold 11, more specifically, provided so as to surround the pattern region 31. The light blocking member 30 blocks, of light emitted from the light source 24, light (leakage light) toward outside of the pattern region 31, that is, a region other than the region where the imprint material on the substrate is in contact with the pattern region 31. Accordingly, the light blocking member 30 is functionally different from the alignment mark used for alignment between the substrate 1 and the mold 11.

Figure 2B:
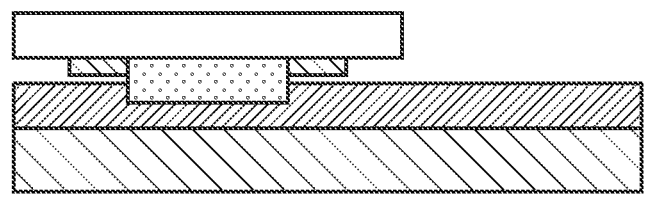

As shown in FIG. 2A, the substrate stage 3 is driven to locate the shot region on the substrate below the pattern region 31 of the mold 11 (imprint position). Then, as shown in FIG. 2B, the mold stage 13 is lowered (driven downward in the Z-axis direction) to bring the pattern region 31 of the mold 11 into contact with the imprint material 29 on the substrate.

Figure 2C:
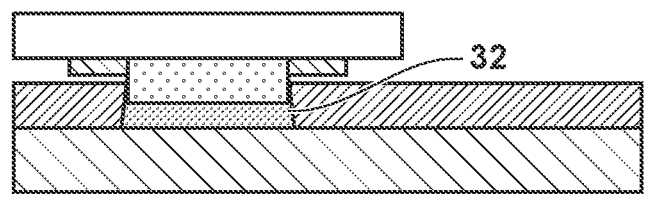

Next, as shown in FIG. 2C, in a state in which the imprint material 29 on the substrate and the pattern region 31 of the mold 11 are in contact with each other, the imprint material 29 is irradiated with light from the light source 24 to cure the imprint material 29. At this time, since light toward outside the pattern region 31 is blocked by the light blocking member 30 provided on the mold 11, curing of the imprint material 29 existing outside the pattern region 31 is suppressed. The cured imprint material on the substrate will be referred to as an imprint material 32 hereinafter.

Figure 2D:
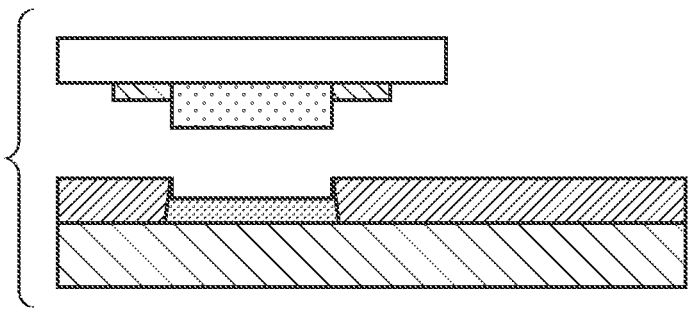
Figure 2E:
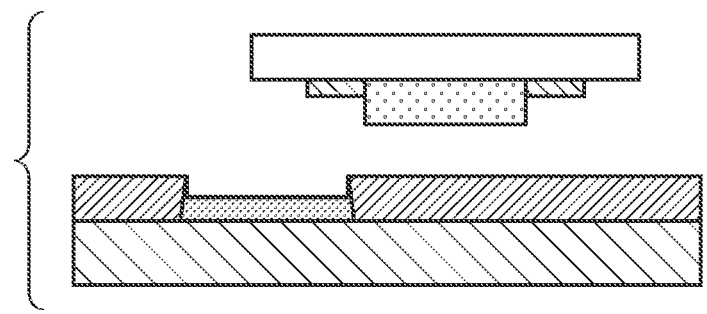
Figure 2F:
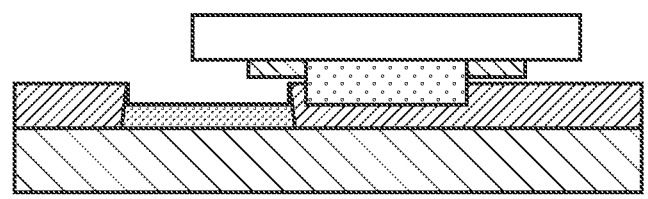
Figure 2G:
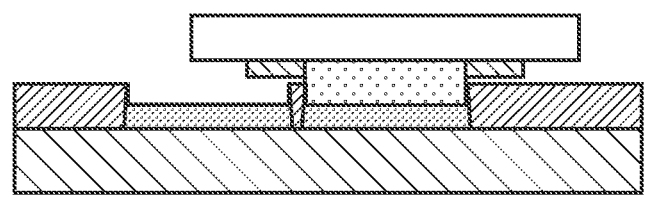
Figure 2H:
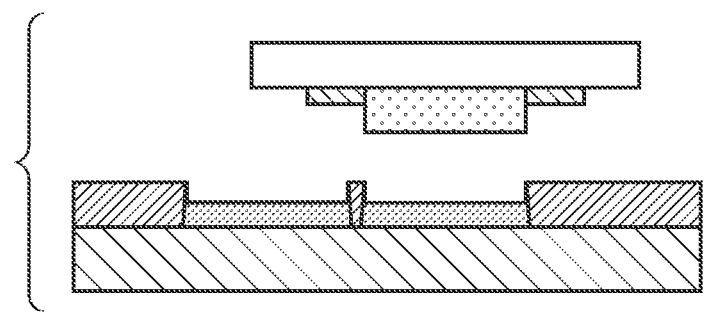

Next, as shown in FIG. 2D, the mold stage 13 is lifted (driven upward in the Z-axis direction) to release the mold 11 from the cured imprint material 32 on the substrate. Thus, a pattern of the imprint material 32 corresponding to the pattern of the mold 11 is formed for one shot region on the substrate.

Then, as shown in FIGS. 2E to 2H, similar processing is performed on another imprint region (for example, an adjacent shot region) on the substrate to form a pattern of the imprint material 32. Therefore, the light blocking effect of the light blocking member 30 provided on the mold 11 suppresses curing of the imprint material 29 existing in a region other than the target shot region of the imprint process.

Figure 3:
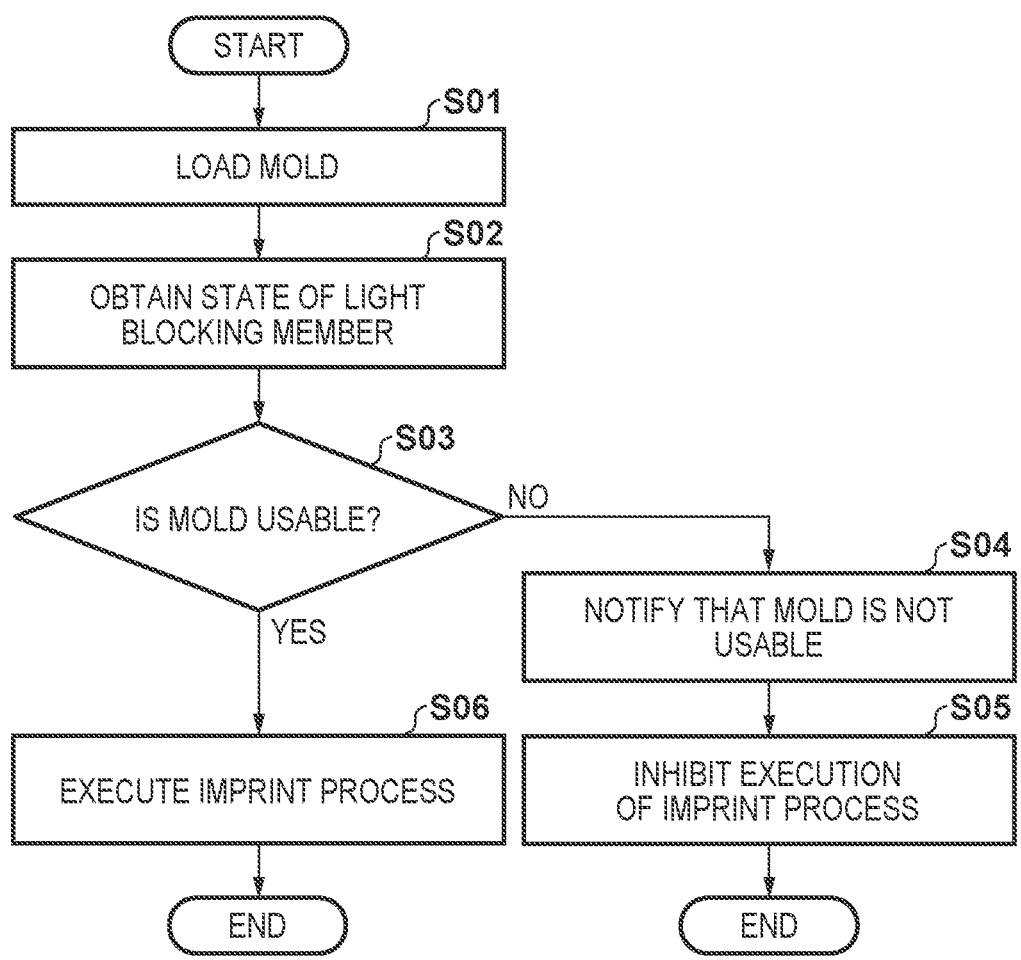
FIG. 3 is a flowchart for describing an operation of the imprint apparatus shown in FIG. 1.

With reference to FIG. 3, an operation (imprint method) of the imprint apparatus 100 in this embodiment will be described. As has been described above, this operation can be executed by the control unit 27 comprehensively controlling respective units of the imprint apparatus 100.

In step S01, the mold 11 is loaded in the imprint apparatus 100. More specifically, the mold 11 is loaded to the imprint apparatus 100 via a mold conveyance unit (not shown), and the mold 11 is held by the mold chuck 12. Note that before loading the mold 11 to the imprint apparatus 100, temperature adaptation of the mold 11 or individual collation of reading a barcode or QR Code® attached to the mold 11 may be performed. Further, after the mold 11 is held by the mold chuck 12, the relative position between the mold 11 and the substrate 1 may be measured, or alignment including measurement using the alignment mark provided on the mold 11 may be performed. By performing such measurement concerning the mold 11, an error (positional shift or the like) at the time of conveyance of the mold 11 can be reduced, and the measurement (obtainment) accuracy concerning the mold 11 and the light blocking member 30 provided on the mold 11 can be improved.

Figure 4A:
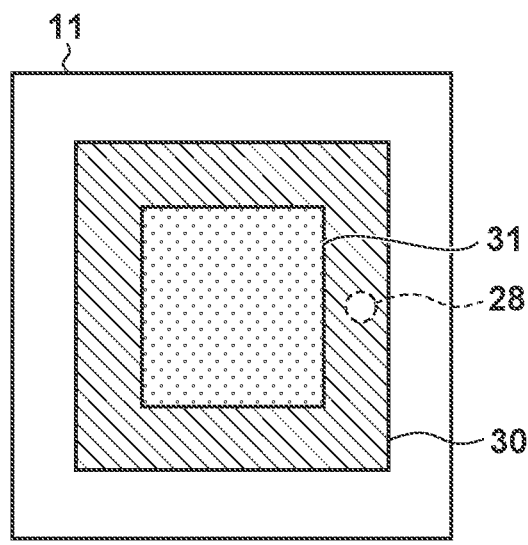
FIGS. 4A and 4B are views showing an example of obtaining the state of a light blocking member provided on a mold.
Figure 4B:
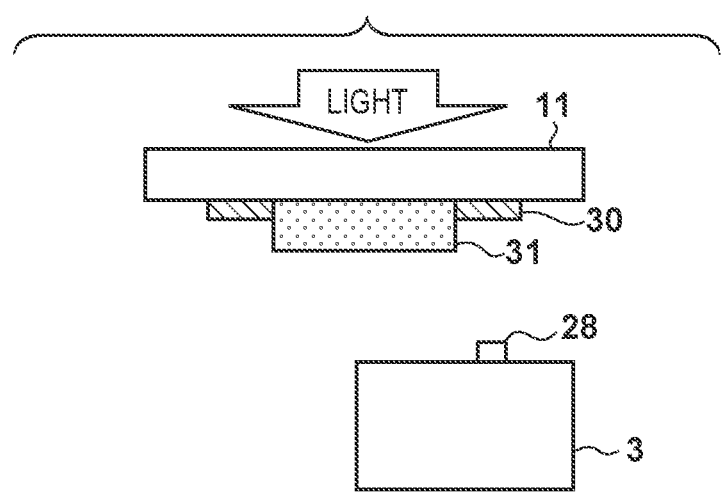

In step S02 (first step), the state of the light blocking member 30 provided on the mold 11 is obtained. For example, as the state of the light blocking member 30 provided on the mold 11, the transmittance of the light blocking member 30 with respect to light emitted from the light source 24 is measured. FIGS. 4A and 4B show measurement of the transmittance as the state of the light blocking member 30 provided on the mold 11. FIG. 4A is a plan view of the mold 11, and FIG. 4B is a side view of the mold 11 (and the substrate stage 3). First, the substrate stage 3 provided with the illuminance measurement unit 28 is driven to locate the illuminance measurement unit 28 immediately below the light blocking member 30. Then, the mold 11 is irradiated with light from the light source 24, and the illuminance measurement unit 28 measures the illuminance of the light immediately below the light blocking member 30. With this operation, the transmittance of the light blocking member 30 with respect to the light emitted from the light source 24 can be measured. Thus, the illuminance measurement unit 28 functions as an obtainment unit that obtains the state of the light blocking member 30 provided on the mold 11. Note that the illuminance measurement unit 28 may measure the illuminance of the light at one position immediately below the light blocking member 30 or at a plurality of positions immediately below the light blocking member 30. In this embodiment, the measurement position is limited (to be at least one position), thereby shortening the time required to obtain the state of the light blocking member 30.

In step S03 (second step), based on the state of the light blocking member 30 obtained in step S02, it is determined whether the mold 11 is usable. For example, the transmittance obtained as the state of the light blocking member 30 is compared to a threshold value and if the transmittance of the light blocking member 30 is higher than the threshold value, it is determined that the mold 11 is not usable, that is, the mold 11 is unusable, and the process transitions to step S04. On the other hand, the transmittance obtained as the state of the light blocking member 30 is compared to the threshold value and if the transmittance of the light blocking member 30 is equal to or lower than the threshold value, it is determined that the mold 11 is usable, and the process transitions to step S06.

Note that the threshold value is set in a range of the light blocking member 30 required to prevent curing of the imprint material 29 on the substrate, for example, set to be 20% or less in a case of the transmittance. This is because the imprint material 29 on the substrate starts to be cured at 20% of the exposure amount required to completely cure the imprint material 29. In other words, the threshold value is set so as to ensure (guarantee) the performance of the light blocking member 30 for blocking 80% or more of the incident light.

In step S04, it is notified that the mold 11 is not usable. For example, the user is notified that the mold 11 is not usable by issuing an alert via a display or a loudspeaker of the imprint apparatus 100. In step S05, execution of the imprint process of forming a pattern of the imprint material on the substrate is inhibited. Here, execution of the imprint process may be inhibited by the control unit 27 performing control such that the imprint process is not executed until the mold 11 is replaced with the new mold 11. Alternatively, execution of the imprint process may be inhibited by the control unit 27 performing control such that the imprint process is not executed until the user permits the imprint process. Note that the order of steps S04 and S05 may be exchanged, or they may be performed in parallel.

In step S06 (third step), the imprint process of forming a pattern of the imprint material on the substrate is executed using the mold 11 determined to be usable in step S03. Note that since specific processing in the imprint process is as described above (for example, see FIGS. 2A to 2H), a detailed description thereof will be omitted here. If all of the plurality of shot regions on the substrate have undergone the imprint process, the substrate 1 is replaced with a new substrate, and execution of the imprint process may be continued for the new substrate.

As has been described above, this embodiment is advantageous in determining whether the mold 11 provided with the light blocking member 30 is usable. With this embodiment, it is possible to prevent execution of the imprint process using the mold 11 in which the light blocking performance of the light blocking member 30 has been deteriorated and the intended light blocking effect cannot be obtained, and suppress curing of the imprint material protruding outside the shot region on the substrate.

Note that in this embodiment, it is determined whether the mold 11 is usable after the mold 11 is loaded to the imprint apparatus 100. However, the present invention is not limited to this. For example, it may be determined whether the mold 11 is usable before the mold 11 is loaded to the imprint apparatus 100 or in the process of loading the mold 11.

Further, the state of the light blocking member 30 provided on the mold 11 is not limited to the transmittance of the light blocking member 30. For example, as the state of the light blocking member 30, the relative value between the illuminance below the pattern region 31 and the illuminance below the light blocking member 30 in the state in which the mold 11 is irradiated with light from the light source 24 may be measured.

Figure 5A:
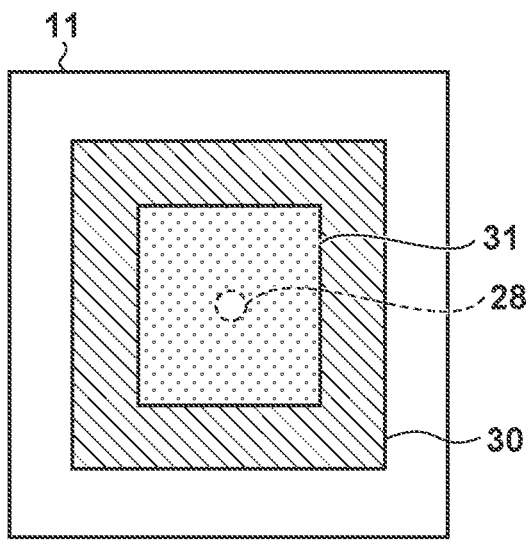
FIGS. 5A to 5D are views showing another example of obtaining the state of the light blocking member provided on the mold.
Figure 5C:
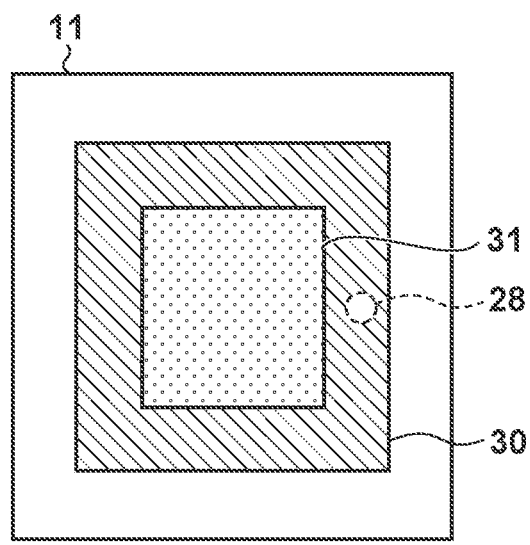
Figure 5B:
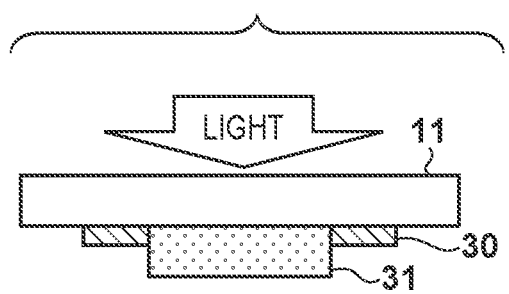
Figure 5B:
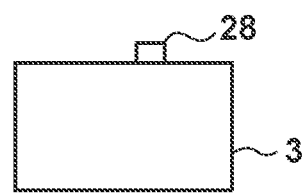
Figure 5D:
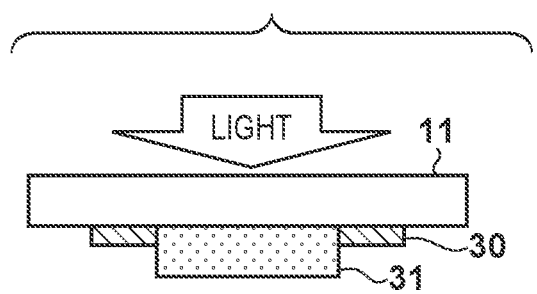
Figure 5D:
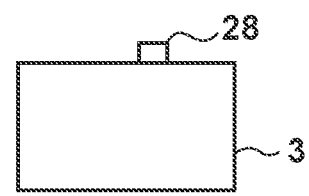

FIGS. 5A to 5D show measurement of the relative value between the illuminance below the pattern region 31 and the illuminance below the light blocking member 30 as the state of the light blocking member 30 provided on the mold 11. Each of FIGS. 5A and 5C is a plan view of the mold 11, and each of FIGS. 5B and 5D is a side view of the mold 11 (and the substrate stage 3). First, as shown in FIGS. 5A and 5B, the substrate stage 3 provided with the illuminance measurement unit 28 is driven to locate the illuminance measurement unit 28 immediately below a central portion of the pattern region 31 (a portion where no light blocking member 30 exists). Then, the mold 11 is irradiated with light from the light source 24, and the illuminance measurement unit 28 measures the illuminance of the light immediately below the central portion of the pattern region 31. At this time, the illuminance measurement unit 28 measures the illuminance of the light at one or a plurality of positions immediately below the central portion of the pattern region 31. Second, as shown in FIGS. 5C and 5D, the substrate stage 3 provided with the illuminance measurement unit 28 is driven to locate the illuminance measurement unit 28 immediately below the light blocking member 30. Then, the mold 11 is irradiated with light from the light source 24, and the illuminance measurement unit 28 measures the illuminance of the light immediately below the light blocking member 30. At this time, the illuminance measurement unit 28 measures the illuminance of the light at one or a plurality of positions immediately below the light blocking member 30. With this operation, the relative value between the illuminance below the pattern region 31 and the illuminance below the light blocking member 30 in the state in which the mold 11 is irradiated with light from the light source 24 can be measured. Here, the relative value between the illuminance below the pattern region 31 and the illuminance below the light blocking member 30 is an index indicating the ratio of the light amount (exposure amount) of the light passing through the light blocking member 30 to the light amount of the light passing through the pattern region 31.

If the relative value between the illuminance below the pattern region 31 and the illuminance below the light blocking member 30 obtained as described above is equal to or smaller than a certain reference value (threshold value), it is determined that the mold 11 is usable; otherwise, it is determined that the mold 11 is not usable. The certain reference value depends on the exposure amount required to completely cure the imprint material 29 on the substrate. As has been described above, since the imprint material 29 on the substrate starts to be cured at 20% of the exposure amount required to completely cure the imprint material 29, the certain reference value is set so as to ensure (guarantee) the performance of the light blocking member 30 for blocking 80% or more of the incident light.

Figure 6A:
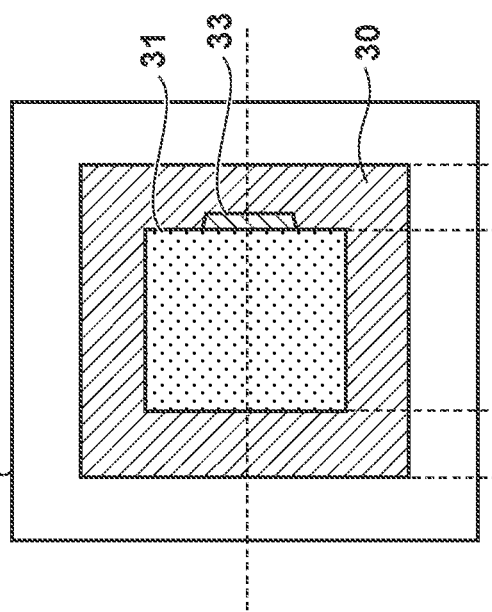
FIGS. 6A to 6D are views showing still another example of obtaining the state of the light blocking member provided on the mold.
Figure 6C:
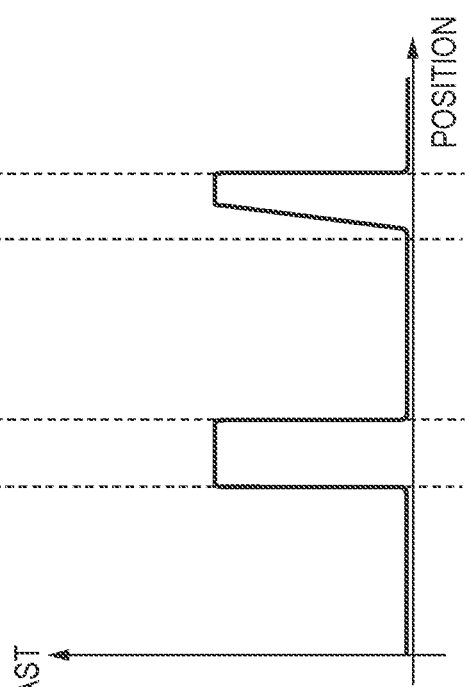
Figure 6B:
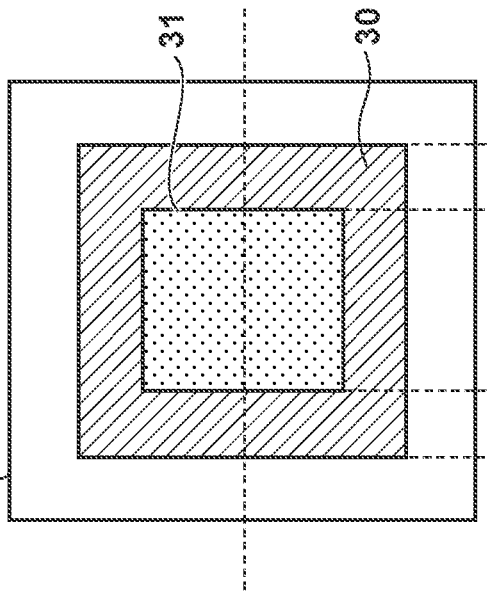
Figure 6D:
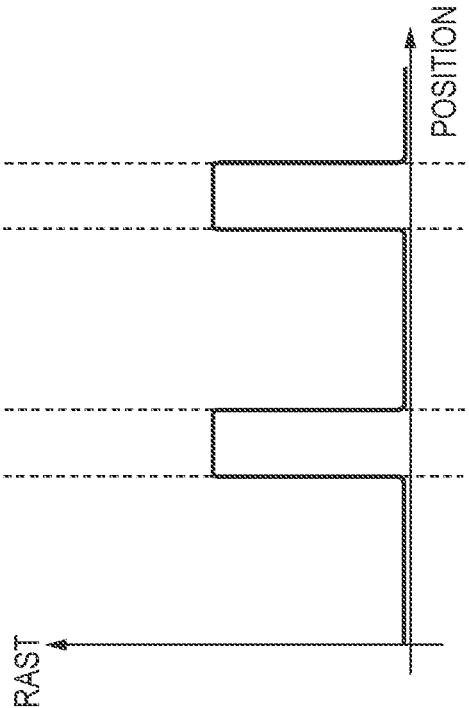

Alternatively, as the state of the light blocking member 30 provided on the mold 11, the contrast of a region of the light blocking member 30 in an image obtained by capturing the mold 11 may be obtained. FIGS. 6A to 6D show obtainment of, as the state of the light blocking member 30, the contrast of a region of the light blocking member 30 in an image obtained by capturing the mold 11. Each of FIGS. 6A and 6C shows an image obtained by capturing the mold 11, and each of FIGS. 6B and 6D is a graph showing the contrast of the region of the light blocking member 30 obtained from the image shown in each of FIGS. 6A and 6C, respectively. The image capturing unit 25 may be used to obtain the images shown in FIGS. 6A and 6C. Accordingly, the image capturing unit 25 functions as an obtainment unit that obtains the state of the light blocking member 30 provided on the mold 11.

Since the light blocking member 30 provided on the mold 11 has a function of blocking light emitted from the light source 24, by obtaining the contrast for each position of the mold 11 from the image shown in FIG. 6A, the graph shown in FIG. 6B is obtained. From the graph obtained in this manner, it is determined whether the mold 11 is usable based on the position where the contrast is high and the intensity of the contrast. For example, as shown in FIG. 6C, consider a case in which an abnormality 33 (for example, peeling or deterioration) has occurred in the light blocking member 30 provided on the mold 11. In this case, by obtaining the contrast for each position of the mold 11 from the image shown in FIG. 6C, the graph shown in FIG. 6D is obtained. By comparing the graph shown in FIG. 6D and the graph shown in FIG. 6B, it can be seen that the contrast decreases and the light blocking effect of the light blocking member 30 decreases in the portion where the abnormality 33 has occurred. Therefore, if the graph shown in FIG. 6D is obtained, it is determined that the mold 11 is not usable. On the other hand, if the graph shown in FIG. 6B is obtained, it is determined that the mold 11 is usable.

When the contrast of a region of the light blocking member 30 in an image by capturing the mold 11 is obtained as the state of the light blocking member 30, the image capturing unit 25 can capture the mold 11 including the light blocking member 30 at one time. Accordingly, the time required to determine whether the mold 11 is usable is only the time required to perform image processing on the image obtained by the image capturing unit 25. Therefore, determination as to whether the mold 11 is usable using the contrast of a region of the light blocking member 30 in an image obtained by capturing the mold 11 is preferably used as primary determination. If it is determined that the mold 11 is not usable, determination (secondary determination) as to whether the mold 11 is usable using the transmittance of the light blocking member 30 or the like is preferably performed.

The step (step S03) of determining whether the mold 11 is usable may include a step of estimating the usable period of the mold 11 based on the state of the light blocking member 30. More specifically, every time the state of the light blocking member 30 provided on the mold 11 is obtained, the state is stored in the storage unit of the imprint apparatus 100. With this operation, a change (change amount) in state of the light blocking member 30 can be obtained, and the usable period of the mold 11 can be estimated based on the change. Then, from the usable period of the mold 11 estimated as described above, it can be determined whether the mold 11 is usable.

As has been described above, cleaning of the mold 11 causes deterioration of the light blocking member 30 provided on the mold 11. Therefore, it is also useful to estimate the usable period of the mold 11 based on the number of times of cleaning (history of cleaning) of the mold 11 which is generally managed by the imprint apparatus 100. For example, the number of times of cleaning of the mold 11 is obtained as the state of the light blocking member 30, and the usable period of the mold 11 is estimated based on the number of times of cleaning of the mold 11 and information indicating the change in state of the light blocking member 30 with respect to the number of times of cleaning of the mold 11.

Figure 7:
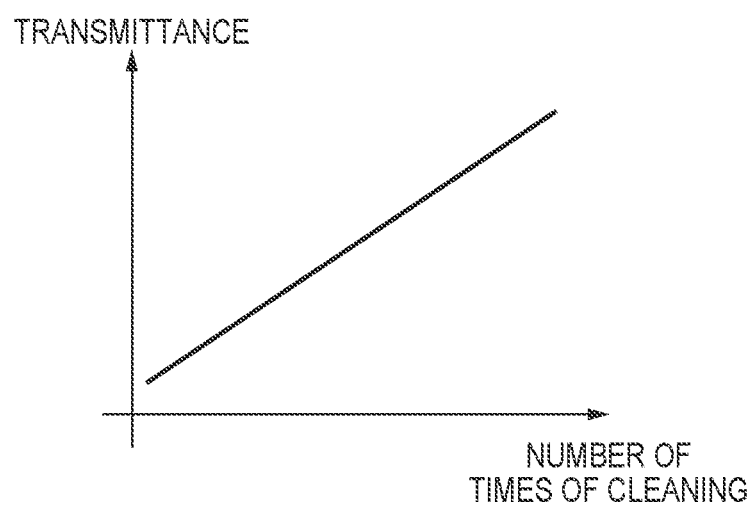
FIG. 7 is a graph showing an example of information indicating the change in state of the light blocking member with respect to the number of times of cleaning of the mold.

The information indicating the change in state of the light blocking member 30 with respect to the number of times of cleaning of the mold 11 needs to be obtained in advance. For example, if the transmittance is used as the light blocking member 30, information indicating a change in transmittance of the light blocking member 30 with respect to the number of times of cleaning of the mold 11 can be obtained as an approximate straight line shown in FIG. 7. Note that since the resistance of the light blocking member 30 to cleaning differs depending on the type and conditions of cleaning of the mold 11, the information indicating the change in state of the light blocking member 30 with respect to the number of times of cleaning of the mold 11 is preferably obtained for each type and each condition of cleaning of the mold 11. Note that the relationship between the number of times of cleaning of the mold 11 and the change in state of the light blocking member 30 is obtained as a curve (approximate curve) in some cases. In such a case, a large number of plots are needed as compared to a case in which the relationship between the number of times of cleaning of the mold 11 and the change in state of the light blocking member 30 is expressed by a straight line.

If the material and surface coating of the light blocking member 30 provided on the mold 11 are the same as in the past, instead of obtaining an approximate straight line or an approximate curve by plotting each change in state of the light blocking member 30, an approximate straight line or an approximate curve obtained from actual plots in the past may be used. With this, it becomes possible to more accurately estimate the usable period of the mold 11. This utilizes an empirical law that if the material and surface coating of the light blocking member 30 are the same as in the past, although the start point of the change in state of the light blocking member 30 differs depending on the thickness of the light blocking member 30, the change amount (inclination) remains the same as in the past.

Further, similar to the notification that the mold 11 is not usable, a notification of the estimated usable period of the mold 11 may be also provided to the user via the display or the loudspeaker of the imprint apparatus 100. Note that upon providing the notification of the usable period of the mold 11, the notification mode may be changed in accordance with the usable period of the mold 11. For example, as the usable period of the mold 11 decreases (as approaching the end of the usable period), the degree of alert may be increased.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 8A:
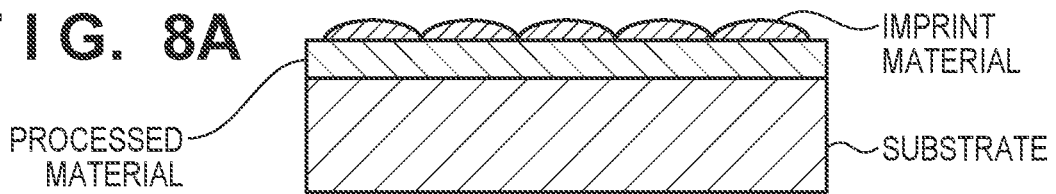
FIGS. 8A to 8F are views for describing an article manufacturing method.

Next, description regarding a detailed method of manufacturing an article is given. As illustrated in FIG. 8A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 8B:
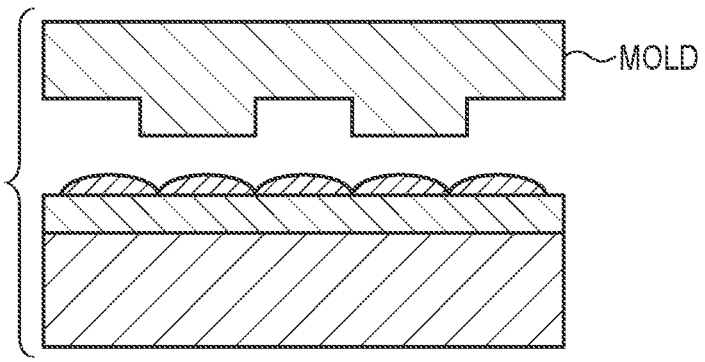
Figure 8C:
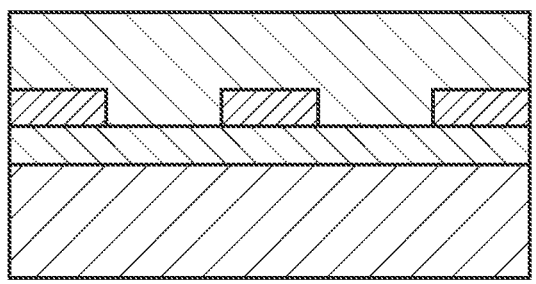

As shown in FIG. 8B, a side of the mold for imprint with a projection and groove pattern formed is directed to and caused to face the imprint material on the substrate. As illustrated in FIG. 8C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 8D:
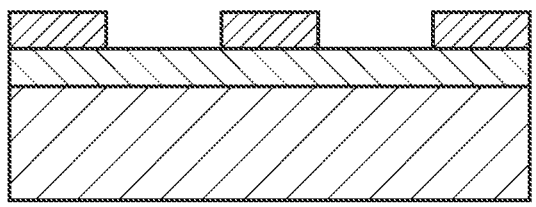

As shown in FIG. 8D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 8E:
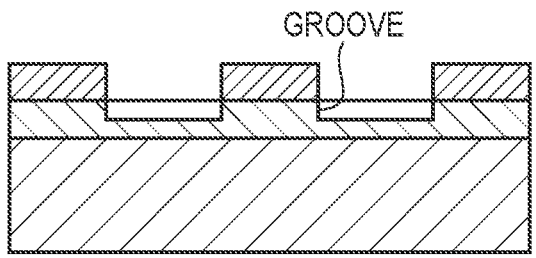
Figure 8F:
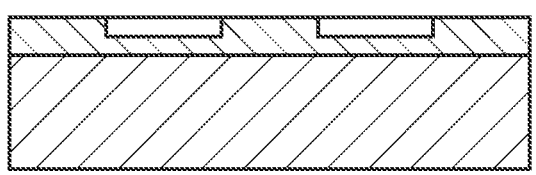

As shown in FIG. 8E, when etching is performed using the pattern of the cured product as an etching resistant mask, a portion of the surface of the processed material where the cured product does not exist or remains thin is removed to form a groove. As shown in FIG. 8F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-084136 filed on May 12, 2020, which is hereby incorporated by reference herein in its entirety.

What is claimed is:

1. An imprint method of forming a pattern of an imprint material on a substrate using a mold, the method comprising:
obtaining a state of a light blocking member provided outside a pattern region of the mold, the light blocking member being configured to block light;
determining, based on the state of the light blocking member obtained in the obtaining, whether the mold is usable; and
curing the imprint material by irradiating the imprint material with the light in a state in which the mold determined to be usable in the determining is in contact with the imprint material on the substrate.

2. The method according to claim 1, further comprising:
measuring a transmittance of the light blocking member with respect the light,
wherein the state of the light blocking member is obtained based on the measured transmittance of the light blocking member with respect the light.

3. The method according to claim 1, further comprising:
measuring an illuminance below the pattern region and an illuminance below the light blocking member in a state in which the mold is irradiated with the light,
wherein the state of the light blocking member is obtained based on a relative value between the measured illuminance below the pattern region and the measured illuminance below the light blocking member.

4. The method according to claim 1, further comprising:
obtaining a contrast of a region of the light blocking member in an image obtained by capturing the mold,
wherein the state of the light blocking member is obtained based on the obtained contrast of the region of the light blocking member in the image obtained by capturing the mold.

5. The method according to claim 1, further comprising notifying that the mold is not usable in a case where the mold is determined to be not usable in the determining.

6. The method according to claim 1, further comprising inhibiting execution of an imprint process of forming the pattern of the imprint material on the substrate in a case where the mold is determined to be not usable in the determining.

7. The method according to claim 1, wherein
the determining includes estimating a usable period of the mold based on the state of the light blocking member obtained in the obtaining.

8. The method according to claim 7, further comprising notifying the usable period of the mold estimated in the determining.

9. The method according to claim 8, wherein
in accordance with the usable period of the mold estimated in the determining, a notification mode of the usable period of the mold is changed.

10. The method according to claim 1, further comprising:
obtaining a number of times of cleaning of the mold,
wherein the state of the light blocking member is obtained based on the obtained number of times of cleaning of the mold, and
the determining includes estimating a usable period of the mold based on the obtained number of times of cleaning of the mold and information indicating a change in the transmittance of the light blocking member with respect to the obtained number of times of cleaning of the mold.

11. The method according to claim 1, wherein
the light blocking member is provided so as to surround the pattern region.

12. An imprint apparatus for forming a pattern of an imprint material on a substrate using a mold, the apparatus comprising:
an obtainment unit configured to obtain a state of a light blocking member provided outside a pattern region of the mold, the light blocking member being configured to block light;
a determination unit configured to determine, based on the state of the light blocking member obtained by the obtainment unit, whether the mold is usable; and
a processing unit configured to perform processing of curing the imprint material by irradiating the imprint material with the light in a state in which the mold determined to be usable by the determination unit is in contact with the imprint material on the substrate.

13. A determination method comprising:
obtaining a state of a light blocking member provided outside a pattern region of a mold which is used when forming a pattern of an imprint material on a substrate, the light blocking member being configured to block light; and
determining, based on the state of the light blocking member obtained in the obtaining, whether the mold is usable.

14. An article manufacturing method comprising:
obtaining a state of a light blocking member provided outside a pattern region of a mold, the light blocking member being configured to block light;
determining, based on the state of the light blocking member obtained in the obtaining, whether the mold is usable;
forming a pattern of an imprint material on a substrate by curing the imprint material by irradiating the imprint material with the light in a state in which the mold determined to be usable in the determining is in contact with the imprint material on the substrate;
processing the substrate on which the pattern is formed in the forming; and
manufacturing an article from the processed substrate.

* * * * *